United States Patent
Motamed

(10) Patent No.: US 9,356,562 B2
(45) Date of Patent: May 31, 2016

(54) FAMILY OF SLEW-ENHANCED OPERATIONAL TRANSCONDUCTANCE AMPLIFIERS

(71) Applicant: Apple Inc., Cupertino, CA (US)

(72) Inventor: A Motamed, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 99 days.

(21) Appl. No.: 14/168,647

(22) Filed: Jan. 30, 2014

(65) Prior Publication Data

US 2015/0214897 A1    Jul. 30, 2015

(51) Int. Cl.
    *H03F 3/45*          (2006.01)
    *H03F 1/22*          (2006.01)

(52) U.S. Cl.
    CPC ............. *H03F 1/223* (2013.01); *H03F 3/45188* (2013.01); *H03F 3/45192* (2013.01); *H03F 2200/234* (2013.01); *H03F 2200/411* (2013.01); *H03F 2203/45002* (2013.01); *H03F 2203/45024* (2013.01); *H03F 2203/45248* (2013.01); *H03F 2203/45536* (2013.01); *H03F 2203/45544* (2013.01); *H03F 2203/45618* (2013.01); *H03F 2203/45674* (2013.01); *H03F 2203/45676* (2013.01); *H03F 2203/45702* (2013.01)

(58) Field of Classification Search
    CPC ........................................................ H03F 3/45
    USPC .......................................... 330/255, 257, 310
    See application file for complete search history.

(56) References Cited

U.S. PATENT DOCUMENTS

| 3,887,879 | A | * | 6/1975 | Radovsky | ............... G05F 3/265 330/257 |
|---|---|---|---|---|---|
| 3,936,731 | A | * | 2/1976 | Wheatley, Jr. | ............ H03F 1/56 330/255 |
| 4,074,205 | A | * | 2/1978 | Robe | .................... H03F 3/45071 330/257 |
| 4,075,574 | A | * | 2/1978 | Gilbert | ................. H03G 1/0005 330/257 |

(Continued)

FOREIGN PATENT DOCUMENTS

JP      2000-163031 A      6/2000
JP      2002-342033 A      11/2002

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Patricia T Nguyen
(74) *Attorney, Agent, or Firm* — Morrison & Foerster LLP

(57) ABSTRACT

Operational transconductance amplifiers (OTAs) with enhanced slew rate are disclosed. An OTA can have a main amplifier and pre-amplifier gain stage to increase the effective transconductance and bandwidth of the OTA. The pre-amplifier and main amplifier can be coupled to enhance slew current without adding additional bias current to the main amplifier input stages. Pre-amplifier bias current can be recycled and redirected to the load. OTAs with enhanced slew rate can be particularly useful in applications requiring high-frequency switching of voltage levels to drive high capacitance lines. For example, an integrated touch sensor panel and display can be operated by alternatively applying a first voltage level to an electrode in a display mode and a second voltage level during a touch sensing mode using OTA sense or charge amplifiers with enhanced slew rate. Enhanced slew rate can increase the time available to demodulate a touch signal for improved system performance.

22 Claims, 10 Drawing Sheets

(56) References Cited

U.S. PATENT DOCUMENTS

| | | | |
|---|---|---|---|
| 4,267,519 | A | 5/1981 | Schade, Jr. |
| 5,142,242 | A * | 8/1992 | Schaffer .................... H03F 3/26 330/253 |
| 5,483,261 | A | 1/1996 | Yasutake |
| 5,488,204 | A | 1/1996 | Mead et al. |
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,414,552 | B1 | 7/2002 | Kronmueller et al. |
| 6,670,941 | B2 | 12/2003 | Albu et al. |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,276,970 | B2 * | 10/2007 | Khorramabadi ...... H03F 1/3211 330/253 |
| 7,557,659 | B2 | 7/2009 | Harvey |
| 7,663,607 | B2 | 2/2010 | Hotelling et al. |
| 7,701,291 | B2 | 4/2010 | Chiu |
| 8,479,122 | B2 | 7/2013 | Hotelling et al. |
| 2002/0003441 | A1 * | 1/2002 | Steensgaard-Madsen ................. H03F 1/083 327/54 |
| 2005/0024143 | A1 * | 2/2005 | Humphrey ............... H03F 1/22 330/255 |
| 2006/0119429 | A1 * | 6/2006 | Lim ...................... H03F 3/189 330/253 |
| 2006/0197753 | A1 | 9/2006 | Hotelling |
| 2013/0249635 | A1 * | 9/2013 | Kim ..................... H03F 3/3028 330/261 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

FAMILY OF SLEW-ENHANCED OPERATIONAL TRANSCONDUCTANCE AMPLIFIERS

FIELD

This relates generally to amplifier circuits, and more particularly, to operational transconductance amplifiers with enhanced slew rate for use with touch sensor panels that are integrated with displays.

BACKGROUND

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface can be detected near the surface without actually touching the surface.

Capacitive touch sensor panels can be formed from a matrix of drive and sense lines of a substantially transparent conductive material, such as Indium Tin Oxide (ITO), often arranged in rows and columns in horizontal and vertical directions on a substantially transparent substrate. It is due in part to their substantial transparency that capacitive touch sensor panels can be overlaid on a display to form a touch screen, as described above. Some touch screens can be formed by partially integrating touch sensing circuitry into a display pixel stack-up (i.e., the stacked material layers forming the display pixels).

Integrating touch sensing circuitry with display circuitry can require high frequency switching of voltage levels to accommodate the different voltage requirements of touch sensing and display modes. Operational transconductance amplifiers (OTAs) can be used with high-capacitance touch sensing and display circuitry because OTAs can maintain a high DC gain and accuracy while maintaining a low noise characteristic and avoiding the compensation complexity and area penalty of multiple stage amplifiers.

One figure of merit used to measure amplifier performance is slew rate, or the maximum rate of change of output voltage with respect to time. High slew rate can be especially important in applications which require high frequency switching of voltage levels, such as in integrated touch sensing and display circuitry. Slew rate can be increased by increasing the OTA bias current, but this method increases the amplifier's quiescent supply current and therefore power consumption.

SUMMARY

The following description includes examples of operational transconductance amplifiers (OTAs) with enhanced slew rate. An OTA can have a main amplifier and pre-amplifier gain stage to increase the effective transconductance and bandwidth of the OTA. The pre-amplifier gain stage and main amplifier can be coupled to enhance the OTA slew current without adding any additional bias current to the main differential amplifier. Current from the pre-amplifier gain stage bias current can be recycled and redirected to the load.

OTAs with enhanced slew rate can be particularly useful in applications requiring high-frequency switching of voltage levels to drive high capacitance lines. For example, an integrated touch sensor panel and display can be operated by alternatively applying a first voltage level to an electrode in a display mode and a second voltage level during a touch sensing mode using OTA sense or charge amplifiers with enhanced slew rate. Enhanced slew rate can increase the time available to demodulate a touch signal for improved system performance.

DETAILED DESCRIPTION

In the following description of examples, reference is made to the accompanying drawings in which it is shown by way of illustration specific examples that can be practiced. It is to be understood that other examples can be used and structural changes can be made without departing from the scope of the various examples.

The following description includes examples of operational transconductance amplifiers (OTAs) with enhanced slew rate that can be used, for example, as sense or charge amplifiers in an integrated touch and display system. In some examples, OTAs can have a pre-amplifier and a main amplifier. Current from a pre-amplifier can be mirrored to the output of an OTA to increase the OTA slew current without increasing the bias current and power of a main amplifier.

OTAs with enhanced slew rate can be particularly useful in applications requiring high-frequency switching of voltage levels to charge up high capacitance lines. For example, integrated touch screens can include high-capacitance electrodes formed of grouped-together circuit elements of the display stack-up. In some examples, the common electrodes (Vcom) in the display TFT layer can be grouped together during a touch sensing mode to form drive and/or sense lines. During a display mode in which an image can be displayed on the touch screen, the Vcom can serve as part of the display circuitry, for example, by carrying a common voltage to create, in conjunction with a pixel voltage on a pixel electrode, an electric field across the liquid crystal. During a touch sensing mode, a stimulation signal can be applied to a group of Vcom that form a drive line. A sense signal based on the stimulation signal can be received by the sense lines formed from a group of Vcom, received by an OTA charge amplifier, and processed by a touch processor to determine an amount and location of touch on the touch screen.

Figure 1A:
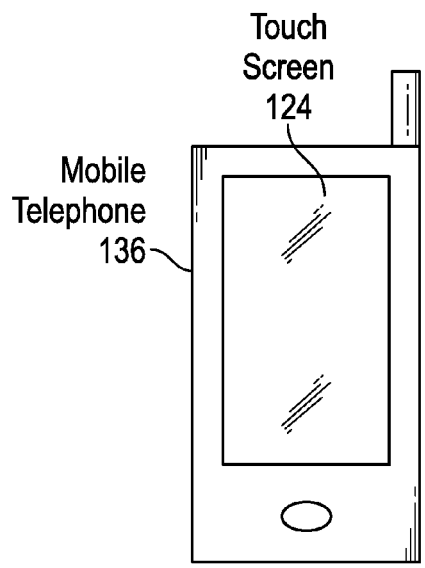
FIGS. 1A-1D illustrate example systems in which a touch screen according to examples of the disclosure can be implemented.
Figure 1B:
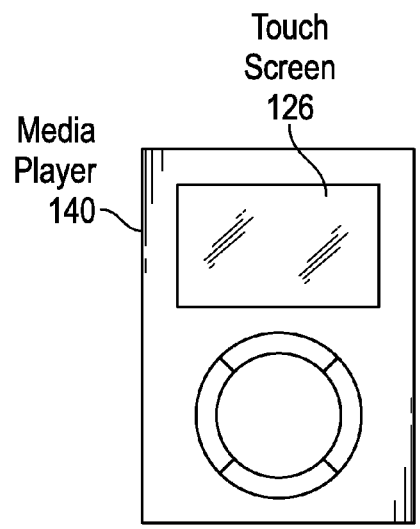
Figure 1C:
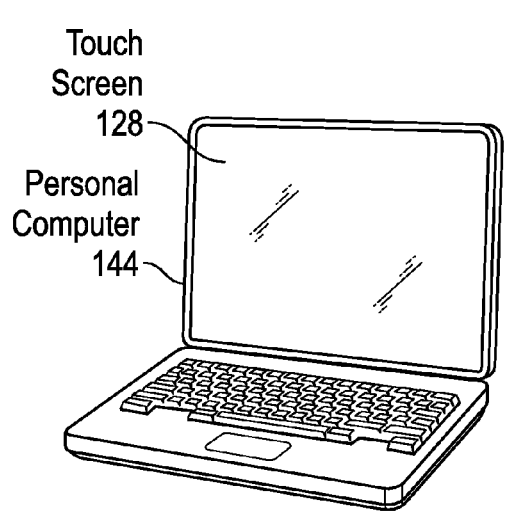
Figure 1D:
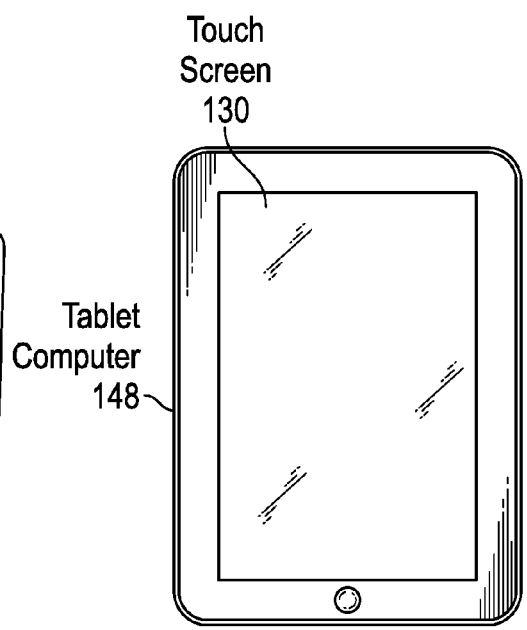

FIGS. 1A-1D illustrate example systems in which a touch screen according to examples of the disclosure can be implemented. FIG. 1A illustrates an example mobile telephone 136 that includes a touch screen 124. FIG. 1B illustrates an example digital media player 140 that includes a touch screen 126. FIG. 1C illustrates an example personal computer 144 that includes a touch screen 128. FIG. 1D illustrates an example tablet computing device 148 that includes a touch screen 130. Touch screens 124, 126, 128 and 130 can be based on mutual capacitance. A mutual capacitance based touch system can include, for example, drive regions and sense regions, such as drive lines and sense lines. For example, drive lines can be formed in rows while sense lines can be formed in columns (e.g., orthogonal). Touch nodes can be formed at the intersections of the rows and columns. During operation, the rows can be stimulated with an AC waveform and a mutual capacitance can be formed between the row and the column of the touch node. As an object approaches the touch node, some of the charge being coupled between the row and column of the touch node can instead be coupled onto the object. This reduction in charge coupling across the touch node can result in a net decrease in the mutual capacitance between the row and the column and a reduction in the AC waveform being coupled across the touch node. This reduction in the charge-coupled AC waveform can be detected by a charge amplifier and measured by the touch sensing system to determine the positions of multiple objects when they touch the touch screen. In some examples, a touch screen can be multi-touch, single touch, projection scan, full-imaging multi-touch, capacitive touch, etc.

Figure 2:
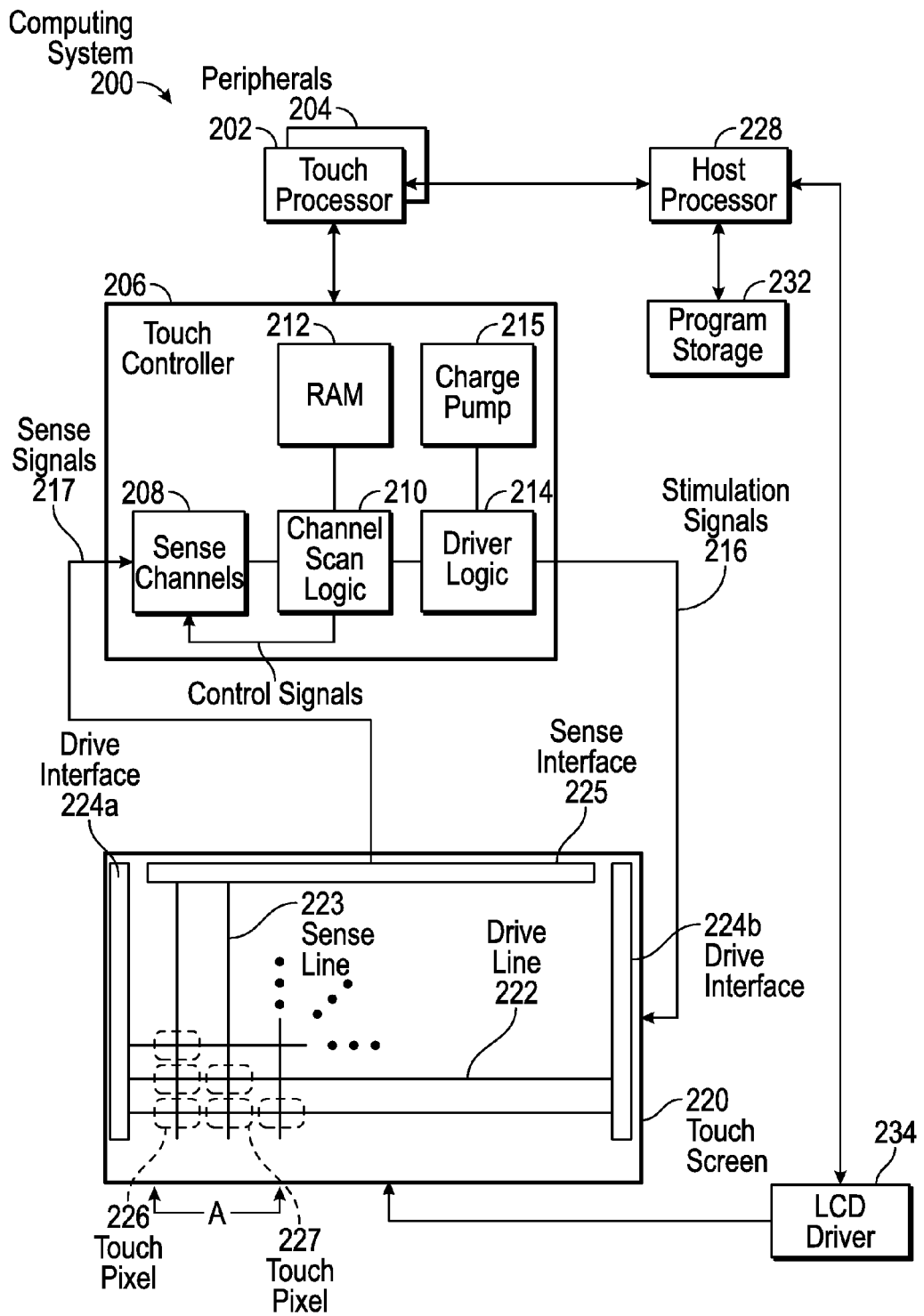
FIG. 2 is a block diagram of an example computing system that illustrates one implementation of an example touch screen according to examples of the disclosure.

FIG. 2 is a block diagram of an example computing system 200 that illustrates one implementation of an example touch screen 220 according to examples of the disclosure. Computing system 200 could be included in, for example, mobile telephone 136, digital media player 140, personal computer 144, or any mobile or non-mobile computing device that includes a touch screen. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 that can include OTAs with enhanced slew rate according to the various examples of the disclosure, channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and phases that can be selectively applied to drive lines of the touch sensing circuitry of touch screen 220, as described in more detail below. In some examples, touch controller 206, touch processor 202 and peripherals 204 can be integrated into a single application specific integrated circuit (ASIC).

Computing system 200 can also include a host processor 228 for receiving outputs from touch processor 202 and performing actions based on the outputs. For example, host processor 228 can be connected to program storage 232 and a display controller, such as an LCD driver 234. The LCD driver 234 can provide voltages on select (gate) lines to each pixel transistor and can provide data signals along data lines to these same transistors to control the pixel display image as described in more detail below. Host processor 228 can use LCD driver 234 to generate an image on touch screen 220, such as an image of a user interface (UI), and can use touch processor 202 and touch controller 206 to detect a touch on or near touch screen 220. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction and includes pathways of different sizes, shapes, materials, etc., and multiple electrically conductive circuit elements that can be electrically connected to form a single electrically conductive pathway. Drive lines 222 can be driven by stimulation signals 216 from driver logic 214 through drive interfaces 224a and 224b, and resulting sense signals 217 generated in sense lines 223 can be transmitted through a sense interface 225 to sense channels 208 (also referred to as an event detection and demodulation circuit) in touch controller 206. The stimulation signal can be an alternating current (AC)

waveform. In this way, drive lines and sense lines can be part of the touch sensing circuitry that can interact to form capacitive sensing nodes, which can be thought of as touch picture elements (touch pixels), such as touch pixels 226 and 227. This way of understanding can be particularly useful when touch screen 220 is viewed as capturing an "image" of touch. In other words, after touch controller 206 has determined an amount of touch detected at each touch pixel in the touch screen, the pattern of touch pixels in the touch screen at which a touch occurred can be thought of as an "image" of touch (e.g. a pattern of fingers touching the touch screen).

Figure 3:
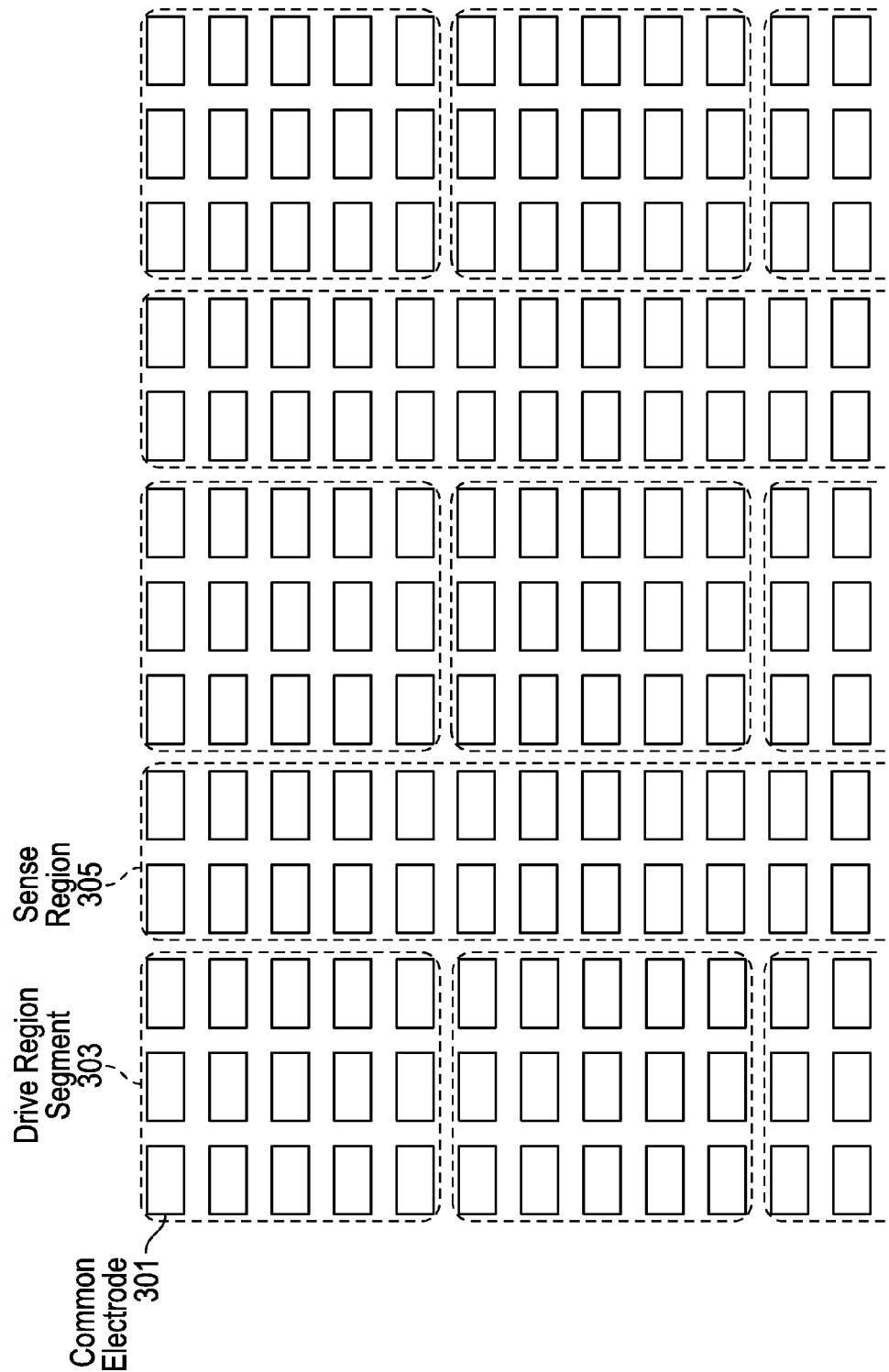
FIG. 3 illustrates an example configuration in which common electrodes (Vcom) can form portions of the touch sensing circuitry of a touch sensing system according to examples of the disclosure.

Touch screen 220 can be an integrated touch screen in which touch sensing circuit elements of the touch sensing system can be integrated into the display pixel stack-ups of a display. FIG. 3 illustrates an example configuration in which common electrodes (Vcom) can form portions of the touch sensing circuitry of a touch sensing system according to examples of the disclosure. Each display pixel includes a common electrode 301, which is a circuit element of the display system circuitry in the pixel stack-up (i.e., the stacked material layers forming the display pixels) of the display pixels of some types of LCD displays that can operate as part of the display system to display an image.

In the example shown in FIG. 3, each common electrode (Vcom) 301 can serve as a multi-function circuit element that can operate as display circuitry of the display system of touch screen 220 and can also operate as touch sensing circuitry of the touch sensing system. In this example, each common electrode 301 can operate as a common electrode of the display circuitry of the touch screen, and can also operate together when grouped with other common electrodes as touch sensing circuitry of the touch screen. For example, a group of common electrodes 301 can operate together as a capacitive part of a drive line or a sense line of the touch sensing circuitry during the touch sensing mode. Other circuit elements of touch screen 220 can form part of the touch sensing circuitry by, for example, electrically connecting together common electrodes 301 of a region, switching electrical connections, etc.

In addition, although examples herein can describe the display circuitry as operating during a display mode, and describe the touch sensing circuitry as operating during a touch sensing mode, it should be understood that a display mode and a touch sensing mode can partially overlap, or the display mode and touch sensing mode can operate at different times.

For example, FIG. 3 shows common electrodes 301 grouped together to form drive region segments 303 and sense regions 305 that generally correspond to drive and sense lines. Grouping multi-function circuit elements of display pixels into a region can mean operating the multi-function circuit elements of the display pixels together to perform a common function of the region. Grouping into functional regions can be accomplished through one or a combination of approaches, for example, the structural configuration of the system (e.g., physical breaks and bypasses, voltage line configurations), the operational configuration of the system (e.g., switching circuit elements on/off, changing voltage levels and/or signals on voltage lines), etc.

Multi-function circuit elements of display pixels of the touch screen can operate in both the display mode and the touch sensing mode. For example, during a touch sensing mode, common electrodes 301 can be grouped together to form touch signal lines, such as drive regions and sense regions. In some examples circuit elements can be grouped to form a continuous touch signal line of one type and a segmented touch signal line of another type. For example, FIG. 3 shows one example in which drive region segments 303 and sense regions 305 correspond to drive and sense lines of touch screen 220. Other configurations are possible in other examples; for example, common electrodes 301 could be grouped together such that drive lines are each formed of a continuous drive region and sense lines are each formed of a plurality of sense region segments linked together through connections that bypass a drive region.

Figure 4:
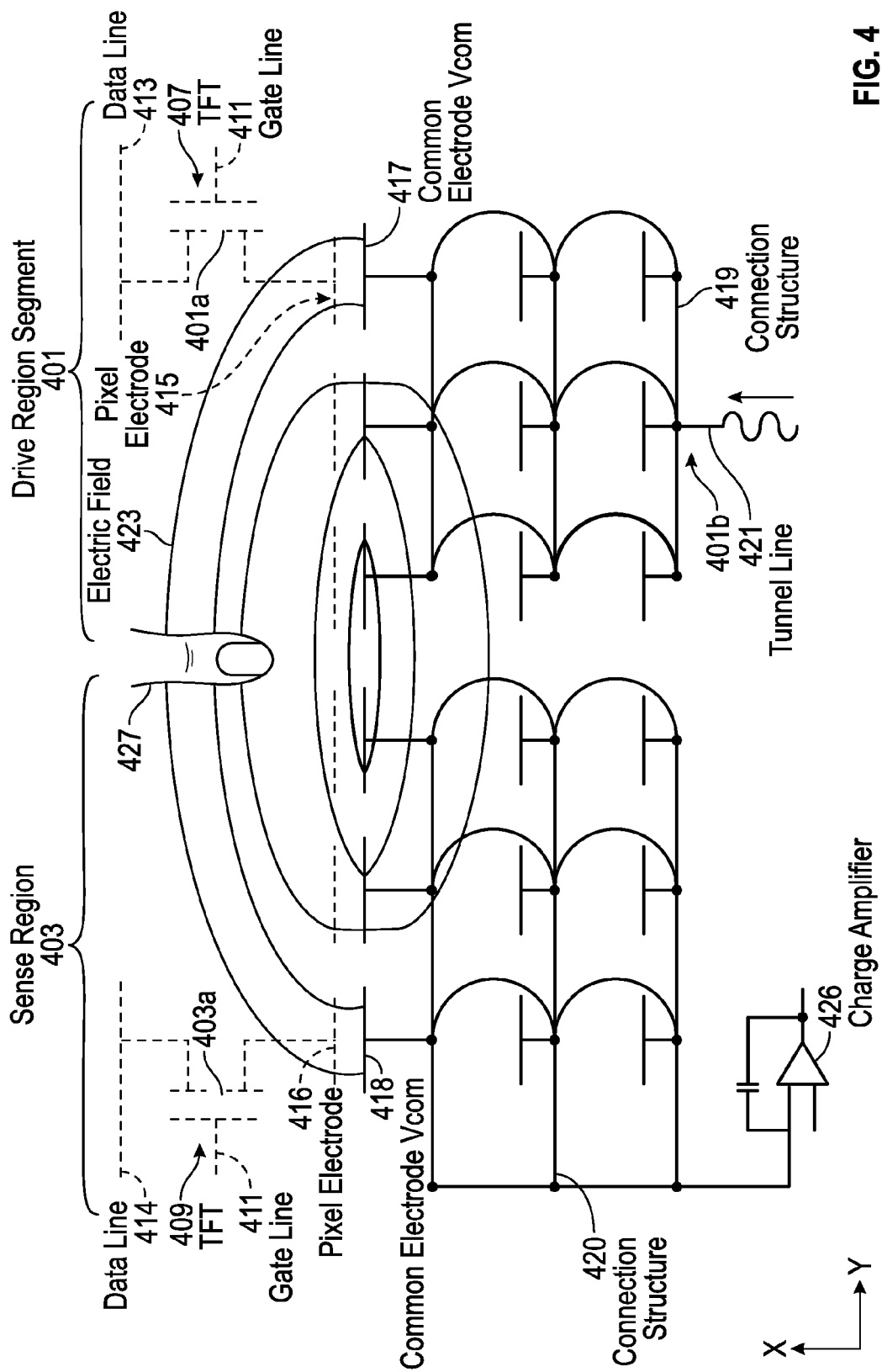
FIG. 4 shows partial circuit diagrams of some of the touch sensing circuitry within display pixels in a drive region segment and a sense region of an example touch screen according to examples of the disclosure.

A touch sensing operation according to examples of the disclosure will be described with reference to FIG. 4. FIG. 4 illustrates partial circuit diagrams of some of the touch sensing circuitry within display pixels in a drive region segment 401 and a sense region 403 of an example touch screen according to examples of the disclosure. For the sake of clarity, only one drive region segment is shown. Also for the sake of clarity, FIG. 4 includes circuit elements illustrated with dashed lines to signify some circuit elements operate primarily as part of the display circuitry and not the touch sensing circuitry. In addition, a touch sensing operation is described primarily in terms of a single display pixel 401a of drive region segment 401 and a single display pixel 403a of sense region 403. However, it is understood that other display pixels in drive region segment 401 can include the same touch sensing circuitry as described below for display pixel 401a, and the other display pixels in sense region 403 can include the same touch sensing circuitry as described below for display pixel 403a. Thus, the description of the operation of display pixel 401a and display pixel 403a can be considered as a description of the operation of drive region segment 401 and sense region 403, respectively.

Referring to FIG. 4, drive region segment 401 includes a plurality of display pixels including display pixel 401a. Display pixel 401a can include a TFT 407, a gate line 411, a data line 413, a pixel electrode 415, and a common electrode 417. FIG. 4 shows common electrode 417 connected to the common electrodes in other display pixels in drive region segment 401 through a connection element 419 within the display pixels of drive region segment 401 that is used for touch sensing as described in more detail below. Sense region 403 includes a plurality of display pixels including display pixel 403a. Display pixel 403a includes a TFT 409, a data line 414, a pixel electrode 416, and a common electrode 418. TFT 409 can be connected to the same gate line 411 as TFT 407. FIG. 4 shows common electrode 418 connected to the common electrodes in other display pixels in sense region 403 through a connection element 420 that can be connected, for example, in a border region of the touch screen to form an element within the display pixels of sense region 403 that is used for touch sensing as described in more detail below.

During a touch sensing mode, gate line 411 can be connected to a voltage source, such as a charge pump, that can apply a voltage to maintain TFTs 409 in the off state. Drive signals can be applied to common electrodes 417 through a tunnel line 421 that is electrically connected to a portion of connection element 419 within a display pixel 401b of drive region segment 401. The drive signals, which are transmitted to all common electrodes 417 of the display pixels in drive region segment 401 through connection element 419, can generate an electrical field 423 between the common electrodes of the drive region segment and common electrodes 418 of sense region 403, which can be connected to a sense amplifier, such as a charge amplifier 426, which can be an enhanced slew rate OTA according to examples of the disclosure. Electrical charge can be injected into the structure of connected common electrodes of sense region 403, and charge amplifier 426 converts the injected charge into a voltage that can be measured. The amount of charge injected, and consequently the measured voltage, can depend on the proximity of a touch object, such as a finger 427, to the drive and sense regions. In this way, the measured voltage can provide an indication of touch on or near the touch screen.

Figure 5:
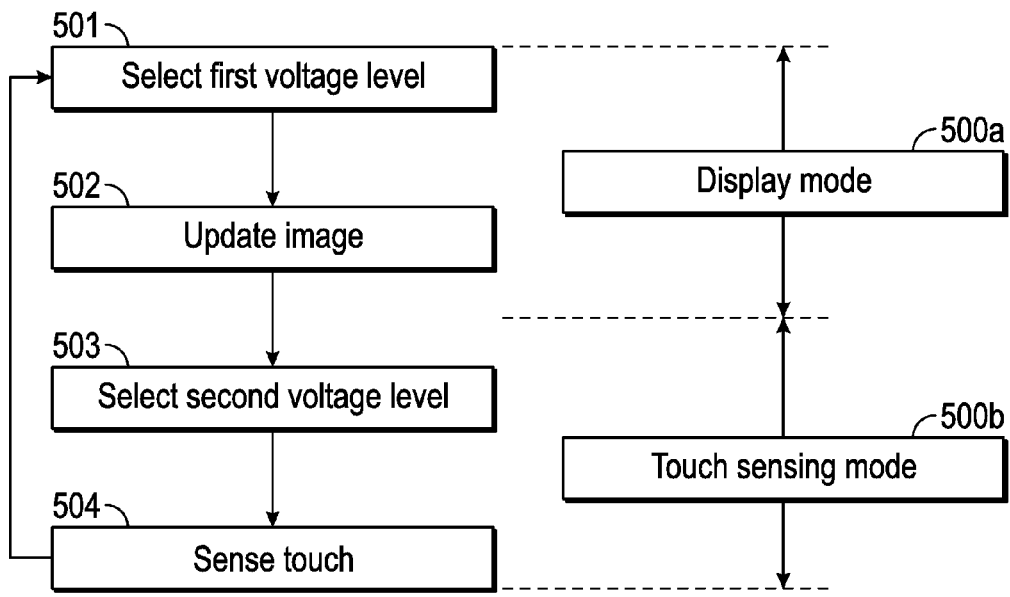
FIG. 5 illustrates an example method of operating a touch screen using different voltage modes for a display mode and a touch sensing mode according to various examples.

An integrated touch screen, such as in the example integrated touch screen described in FIGS. 3 and 4 above, can operate by applying more than one voltage level, including a first voltage level corresponding to a display mode and a second voltage level corresponding to a touch sensing mode. Multi-mode voltages can help reduce crosstalk between, for example, the display system and the touch sensing system. Reducing crosstalk can be beneficial because crosstalk can introduce errors in, for example, touch signals of the touch sensing system. FIG. 5 illustrates an example method of operating a touch screen using different voltage levels for a display mode and a touch sensing mode according to various examples. In a display mode 500*a* of a touch screen operation, a first voltage level can be selected (501), and the image displayed on the touch screen can be updated (502). During the display mode, one or more voltages can be applied at voltage levels corresponding to the first voltage level. In a touch sensing mode 500*b*, a second voltage level can be selected (503), and touch sensing can be performed (504). During the touch sensing mode, the one or more voltages can be applied at voltage levels corresponding to the second voltage level. Applying one or more voltages at different levels during a display mode and a touch sensing mode can allow a voltage-dependent characteristic of one or more components of the touch screen to be adjusted independently in the display and touch sensing modes. In this way, for example, individual component characteristics can be adjusted to better suit the operation of one or both of the display and touch sensing modes. The voltage or voltages that are applied at different levels can be referred to herein as a multi-mode voltage or multi-mode voltages.

Figure 6:
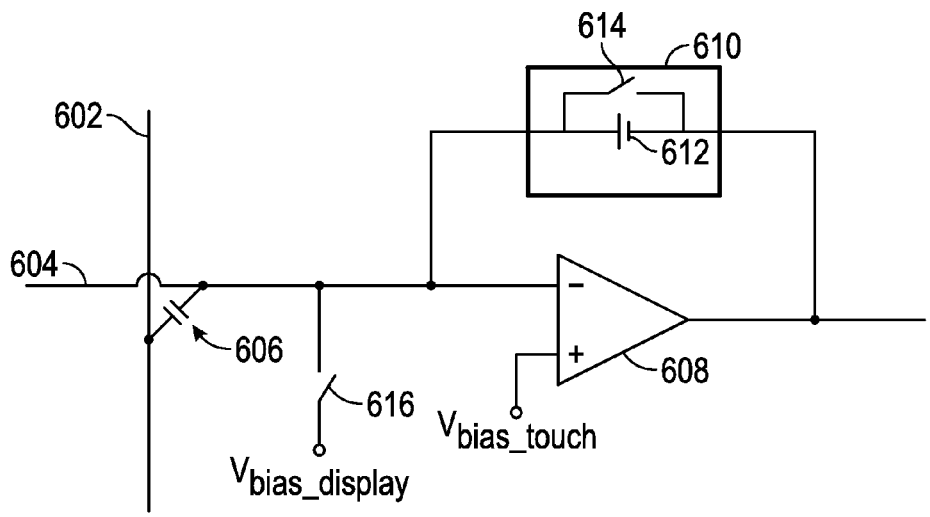
FIG. 6 illustrates the operation of a charge amplifier in an integrated touch screen operating with multi-mode voltages according to examples of the disclosure.

In an integrated touch screen, such as in the example illustrated in FIG. 4, the multi-mode voltages can be applied during touch sensing mode to the sense region using charge amplifier 426, which can be an enhanced slew rate OTA according to examples of the disclosure, and can be the only amplifier connected to sense lines. FIG. 6 illustrates the operation of a charge amplifier in an integrated touch screen operating with multi-mode voltages according to examples of the disclosure. As described above, a mutual capacitance based touch screen can include drive lines and sense lines. For simplicity, only a single drive line 602 and a single sense line 604 are shown. During touch sensing mode, the drive line 602 can be stimulated with an AC waveform and a mutual capacitance 606 can be formed at the intersection between drive line 602 and sense line 604. As an object approaches the intersection between drive line 602 and sense line 604, some of the charge being coupled between drive line 602 and sense line 604 can instead be coupled onto the object. This reduction in charge coupling can be detected and measured by the touch sensing system to determine the positions of multiple objects when they touch the touch screen.

As shown in FIG. 6, charge amplifier 608 configurable with an appropriate feedback network 610 can be used to detect the changes in charge coupling. For example, the feedback network can include a feedback capacitor 612 during a touch sensing mode. When switching from a display mode to a touch sensing mode, the charge amplifier 608 can be used to raise the voltage level on sense line 604 to the common mode voltage level, $V_{bias\_touch}$, used during the touch sensing mode. Charge amplifier 608 can be placed into unity gain operation to charge up the sense line 604. For example, feedback network 610 can be shorted using switch 614 to place charge amplifier 608 into unity gain operation. Once the sense line is finished charging up, switch 614 in feedback network 610 can be opened, allowing charge amplifier 608 to detect charge coupling between the drive line 602 and sense line 604.

When switching from a touch sensing mode to a display mode, for example, each common electrode can be coupled to a reference voltage at the voltage level used during the display mode. As shown in FIG. 6, switch 616 can be used to couple the common electrode(s) forming sense line 604 to the voltage level used during the display mode, $V_{bias\_display}$.

Figure 7A:
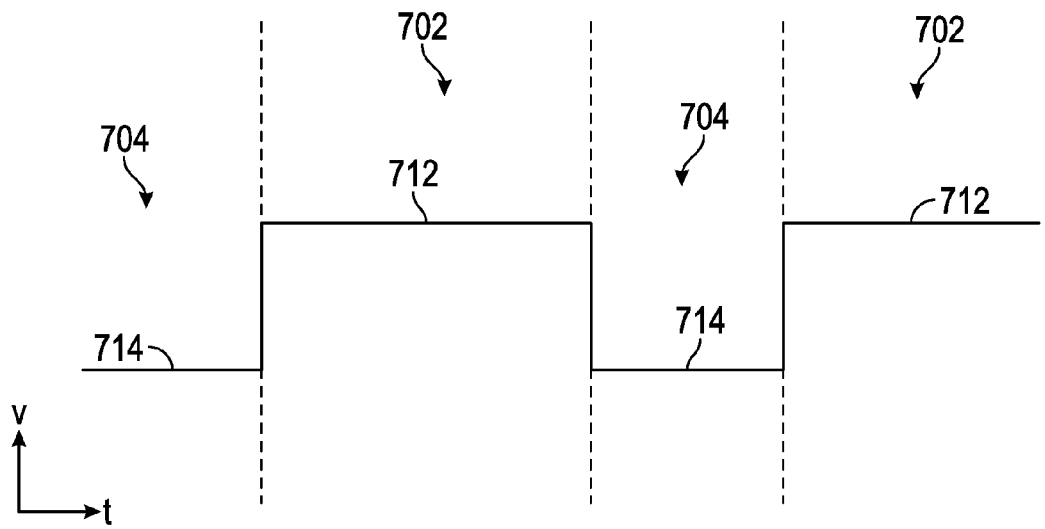
FIGS. 7A and 7B illustrate an exemplary voltage diagram for sense line in a touch sensing mode and a display mode according to examples of the disclosure.
Figure 7B:
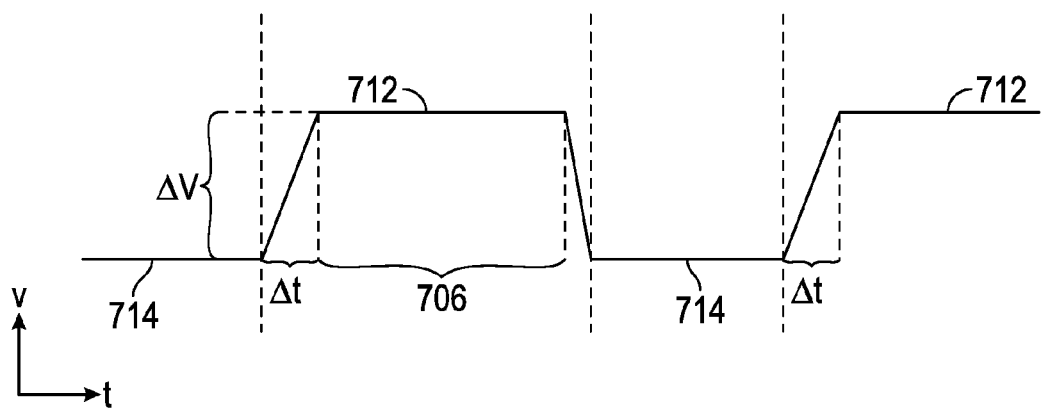

FIGS. 7A and 7B illustrate an exemplary voltage diagram for sense line 604 in a touch sensing mode and a display mode according to examples of the disclosure. As illustrated in FIGS. 7A and 7B, a sense line can be at a touch-sensing voltage level 712 during a touch sensing mode 702 and can be at a display voltage level 714 during a display mode 704. Touch sensing mode 702 can be alternated with display mode 704 such that the two modes are mutually exclusive in time. In other words, the two modes 702 and 704 can be multiplexed in time.

FIG. 7A illustrates the transition between touch sensing voltage level 712 and the display voltage level 714 occurring instantaneously. An instantaneous transition shown between voltage levels 712 and 714 would be ideal because it would maximize the time available for the touch sensing system to detect touch signals, thereby increasing the signal-to-noise (SNR) ratio of touch sensing system. In reality, however, the transition time between voltage levels 712 and 714 is not instantaneous and is limited by the slew rate of the charge amplifier.

FIG. 7B illustrates an exemplary voltage diagram taking slew rate into account. Slew rate can be defined as the maximum rate of change of an output voltage with respect to time, or $\Delta V/\Delta t$. For example, FIG. 7B shows that an amplifier with a given slew rate can transition sense line 604 from display voltage level 714 to touch-sensing voltage level 712 ($\Delta V$), in time period $\Delta t$. In such a system, the time available for the touch sensing 706 can be limited. Therefore, improving the slew rate of the charge amplifier in an integrated touch screen can increase the time available for the touch sensing 706 and the SNR of the touch sensing system. Similarly, when sense line 604 transitions from touch sensing voltage level 712 to display voltage level 714 via switch 616, the transition can occur over a time period rather than instantaneously. The transition time period can be different depending on whether the sense line 604 is transition from touch sensing mode to display mode or from display mode to touch sensing mode.

Figure 8:
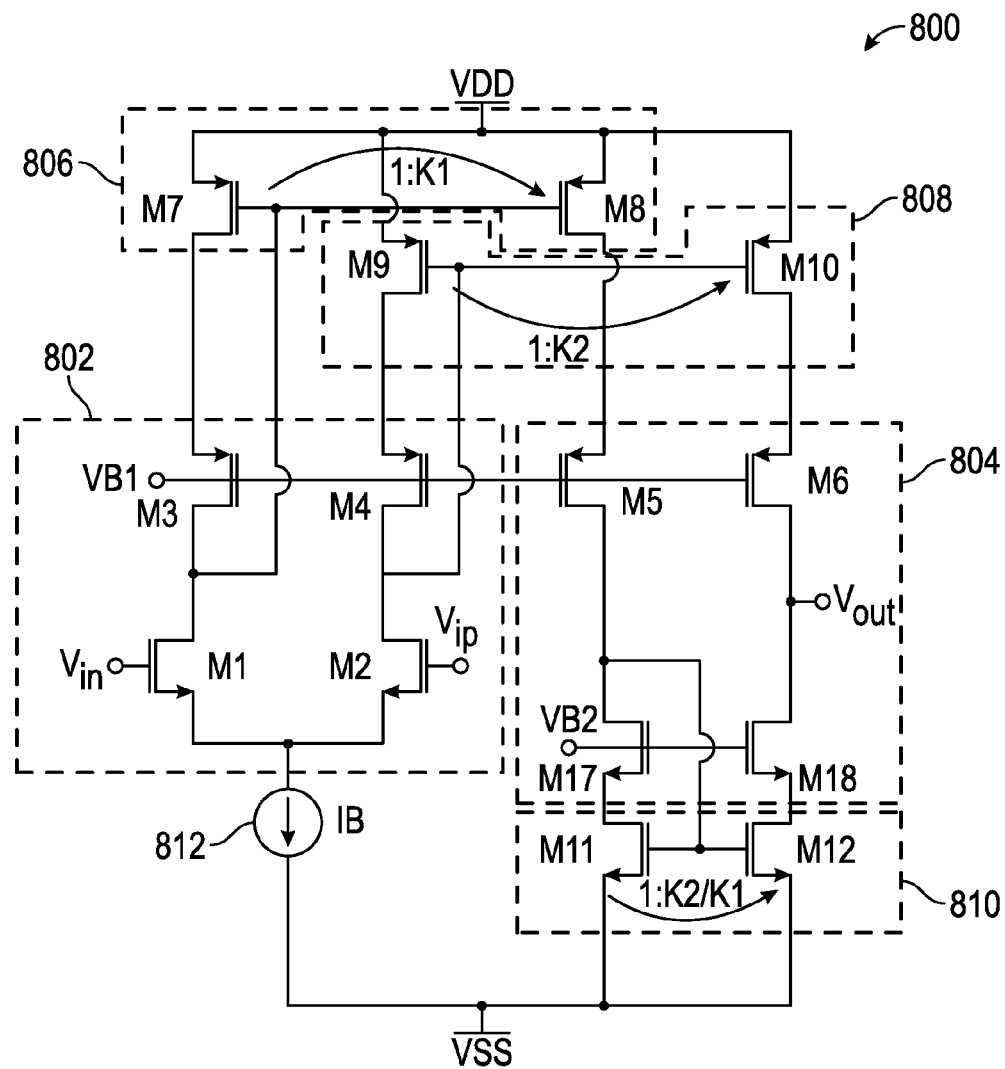
FIG. 8 illustrates an exemplary current mirror OTA topology according to examples of the disclosure.

Charge amplifier 608 can be implemented using an operational transconductance amplifier (OTA). FIG. 8 illustrates an exemplary current mirror OTA 800 topology according to examples of the disclosure. Current mirror OTA 800 can have a cascode differential input stage 802 and a cascode single-ended output stage 804. Input stage 802 can have bias current, $I_B$, 812. The currents of the input stage 802 can be directed to the output stage through current mirrors 806 and 808. Current mirrors 806 and 808 can have input-output mirroring factors of K1 and K2, respectively. The currents of the output stage 804 can be combined via current mirror 810. Current mirror 810 can have an input output mirroring factor of K2/K1.

The unity gain frequency, $\omega_u$, of current mirror OTA 800 can be calculated from the transconductance, gm, of the input differential pair of transistors (M1 and M2), and the load capacitance, $C_L$, at the output of the OTA (not shown). Specifically, unity gain frequency can be expressed as:

$$\omega_u = \frac{gm}{c_L} \quad (1)$$

For a fixed load capacitance, unity gain frequency can be increased by increasing gm. In MOS technology, for a fixed transistor aspect ratio W/L, gm can scale sub-linearly with bias current. Specifically, for long channel devices in strong inversion the relationship can be expressed as:

$$gm \propto \sqrt{I_B} \quad (2)$$

In other words, doubling the unity gain frequency requires quadrupling the bias current. The W/L ratio of input transistors can be increased to maintain a linear transconductance-current relationship; however, increasing the W/L ratio increases the amplifier input capacitance and lowers the amplifier's feedback factor for a given feedback and input network.

Current mirror OTA 800 can have a slewing current directly proportional to bias current $I_B$, 812. Current mirror OTA 800 can have quiescent current, $I_Q$, proportional to bias current $I_B$, 812. Slew current, $I_{Slew}$ and quiescent current, $I_Q$, can be expressed as:

$$I_{Slew} = K_2 I_B \quad (3)$$

$$I_Q = \left(1 + \frac{K_1}{2} + \frac{K_2}{2}\right) I_B \quad (4)$$

Figure 9:
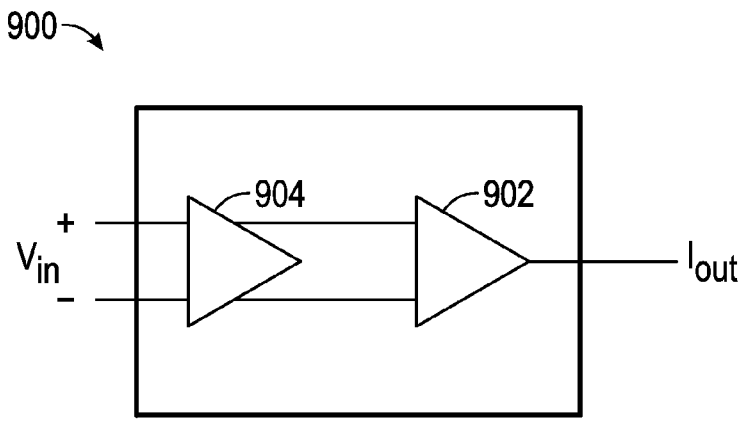
FIG. 9 illustrates an exemplary OTA with a pre-amplifier gain stage according to examples of the disclosure.

FIG. 9 illustrates an exemplary OTA with a pre-amplifier gain stage 900 according to examples of the disclosure. OTA 900 can have two amplifier stages, main amplifier 902 and pre-amplifier gain stage 904. The use of a pre-amplifier gain stage 904, also known as a gm-multiplier, in front of the main amplifier 902 can increase the transconductance and unity gain frequency of the OTA 900. For example, if main amplifier stage 902 has a transconductance of gm and pre-amplifier gain stage 904 has a voltage gain of $A_p$, the effective transconductance, $GM_{eff}$, of OTA 900 can be increased to the product of $A_p$ and gm. Pre-amplifier gain stage 904 can be implemented as a resistively loaded differential pair with a transconductance gain of $gm_p$ and an output impedance of $R_L$. Pre-amplifier gain, $A_p$, can be expressed as:

$$A_p = gm_p R_L \quad (5)$$

Pre-amplifier gain stage 904 can also improve the input referred noise characteristic of OTA 900 by suppressing the noise contribution of the rest of main amplifier 902 by a factor of $A_p$. The slew current of OTA 900, however, remains limited by the bias current of main amplifier 902.

Adding pre-amplifier gain stage 904 should not pose stability concerns for the OTA as long as the pole formed at the output of the pre-amplifier gain stage 904 is at least three times higher than the dominant pole at the output of the OTA 900. This design criterion can be readily met in applications requiring slew enhancement, i.e. driving medium to large output load capacitances.

Figure 10:
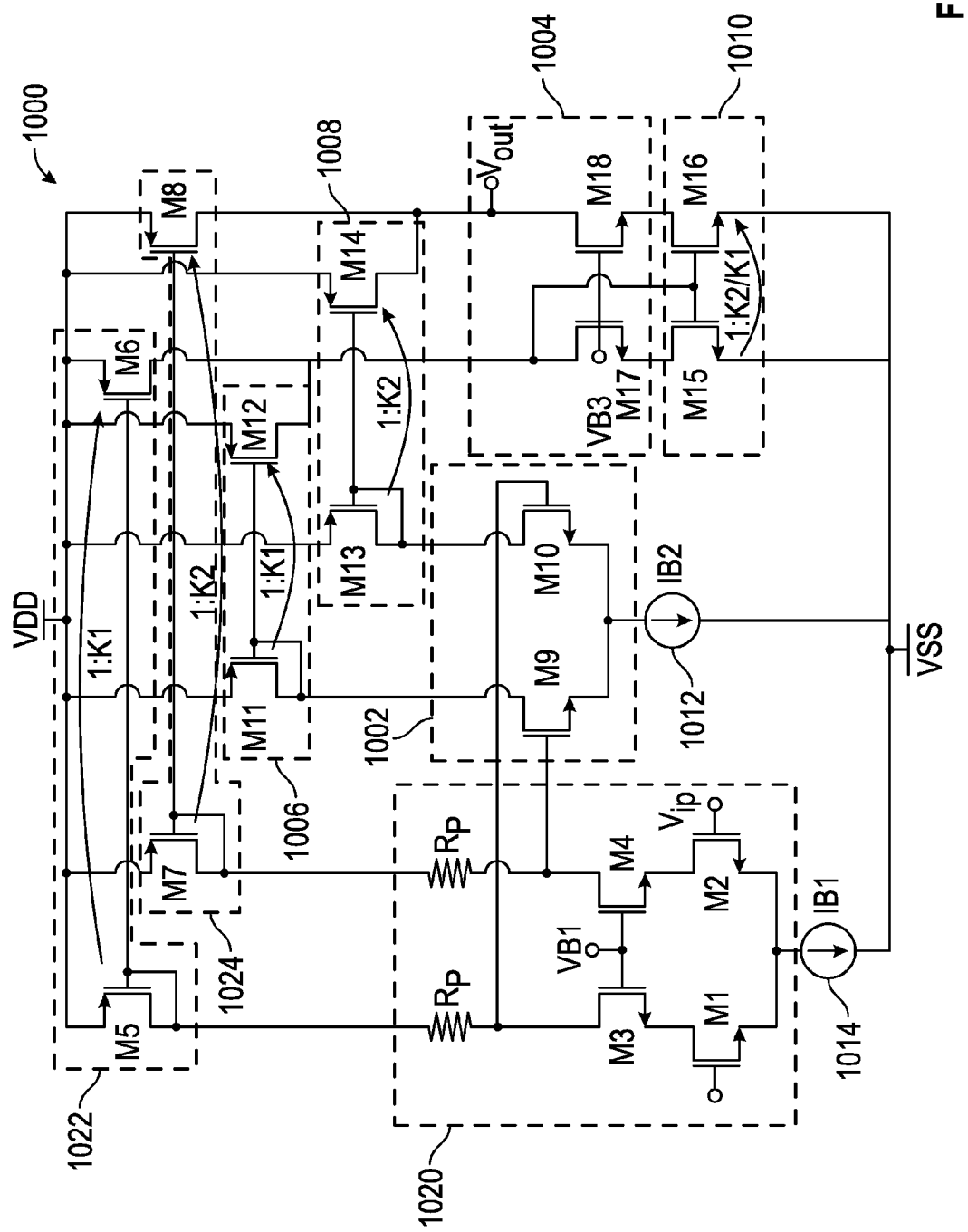
FIG. 10 illustrates an exemplary OTA topology with enhanced slew rate according to examples of the disclosure.

FIG. 10 illustrates an exemplary OTA topology with enhanced slew rate according to examples of the disclosure. OTA 1000 can have a cascode differential input pre-amplifier gain stage 1020. The main amplifier can have a differential input stage 1002 and a single-ended output stage 1004. Pre-amplifier gain stage 1020 can have bias current, $I_{B1}$, 1014 and main amplifier can have bias current, $I_{B2}$, 1012 at the input stage 1002. The currents of the main amplifier input stage 1002 can be directed to the main amplifier output stage 1004 through current mirrors 1006 and 1008. Current mirrors 1006 and 1008 can have input-output mirroring factors of K1 and K2, respectively. The currents of the pre-amplifier gain stage 1020 can be directed to the main amplifier output stage 1004 through current mirrors 1022 and 1024. Current mirrors 1022 and 1024 can have input-output mirroring factors of K1 and K2, respectively. The currents of the main amplifier output stage 1004 can be combined via current mirror 1010. Current mirror 1010 can have an input output mirroring factor of K2/K1.

Mirroring current from pre-amplifier gain stage 1020 to the main amplifier output stage 1004 can increase the slew rate of OTA 1000. In the OTA topology of FIG. 10, the slew current, $I_{Slew}$ and quiescent current, $I_Q$, can be expressed as:

$$I_{Slew} = K_2(I_{B1} + I_{B2}) \quad (6)$$

$$I_Q = \left(1 + \frac{K_1}{2} + \frac{K_2}{2}\right)(I_{B1} + I_{B2}) \quad (7)$$

Thus, OTA 1000 can provide the advantage of increasing the ratio of slew current to quiescent current of the amplifier without increasing the bias current of the main amplifier input stage. Increasing the ratio of slew current to quiescent current can improve power efficiency of the main amplifier.

Figure 11:
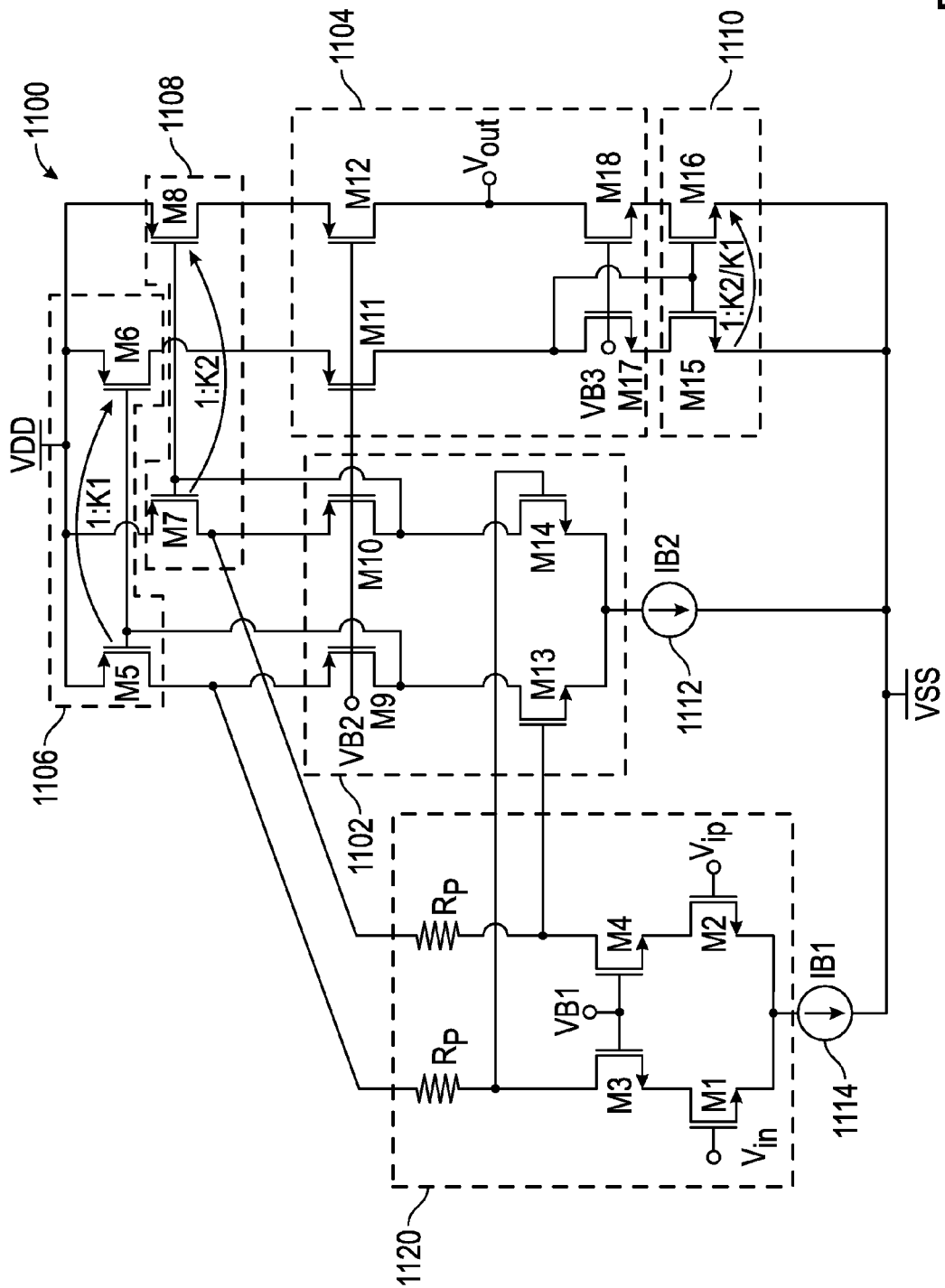
FIG. 11 illustrates another exemplary OTA topology with enhanced slew rate according to examples of the disclosure.

FIG. 11 illustrates another exemplary OTA topology with enhanced slew rate according to examples of the disclosure. OTA 1100 can have a cascode differential input pre-amplifier gain stage 1020. The main amplifier can have a cascode differential input stage 1102 and a cascode single-ended output stage 1104. Pre-amplifier gain stage 1120 can have bias current, $I_{B1}$, 1114 and main amplifier can have bias current, $I_{B2}$, 1112 at the input stage 1102. The currents of the main amplifier input stage 1102 can be directed to the main amplifier output stage 1104 through current mirrors 1106 and 1108. Current mirrors 1106 and 1108 can have input-output mirroring factors of K1 and K2, respectively. The currents of the pre-amplifier gain stage 1120 can also be directed to the main amplifier output stage 1104 through current mirrors 1106 and 1108. The currents of the main amplifier output stage 1104 can be combined via current mirror 1110. Current mirror 1110 can have an input output mirroring factor of K2/K1.

Mirroring current from pre-amplifier gain stage 1120 to the main amplifier output stage 1104 can increase the slew rate of OTA 1100. In the OTA topology of FIG. 11, the slew current, $I_{Slew}$ and quiescent current, $I_Q$, can be expressed the same way as in equations 6 and 7 above. Thus, OTA 1100 can also provide the advantage of increasing the slew current of the amplifier without increasing the bias current of main amplifier input stage. OTA 1100 can also increase the ratio of slew current to the quiescent current of the amplifier and thereby improve the power efficiency of the amplifier. Additionally, OTA 1100 can operate at a lower supply voltage than OTA 1000 because the diode connected transistors M5 and M7 in FIG. 10 are avoided. Specifically, the supply voltage can be reduced by one PMOS transistor threshold voltage.

The topology of FIG. 11 can be designed to have a negative internal feedback loop to guarantee stability of the OTA 1100. Specifically, the feedback loop between the pre-amplifier gain stage 1120 and main amplifier input stage 1102 can include transistors M13, M14, M9, M5 and $R_p$. An increase in the gate voltage of transistor M13 can increase the drain current of transistor M13. The increase in drain current of transistor M13 can increase the current though transistor M9 and thereby increase the source voltage of transistor M9. Because $I_{B1}$ can be fixed, the voltage drop across $R_p$ can be constant. As a result, an increase in the source voltage of transistor M9 can increase the gate voltage of transistor M14. The increase in voltage at M14 can increase the drain current of transistor M14 which can reduce the drain current of transistor M13 because $I_{B2}$ can be fixed.

Figure 12:
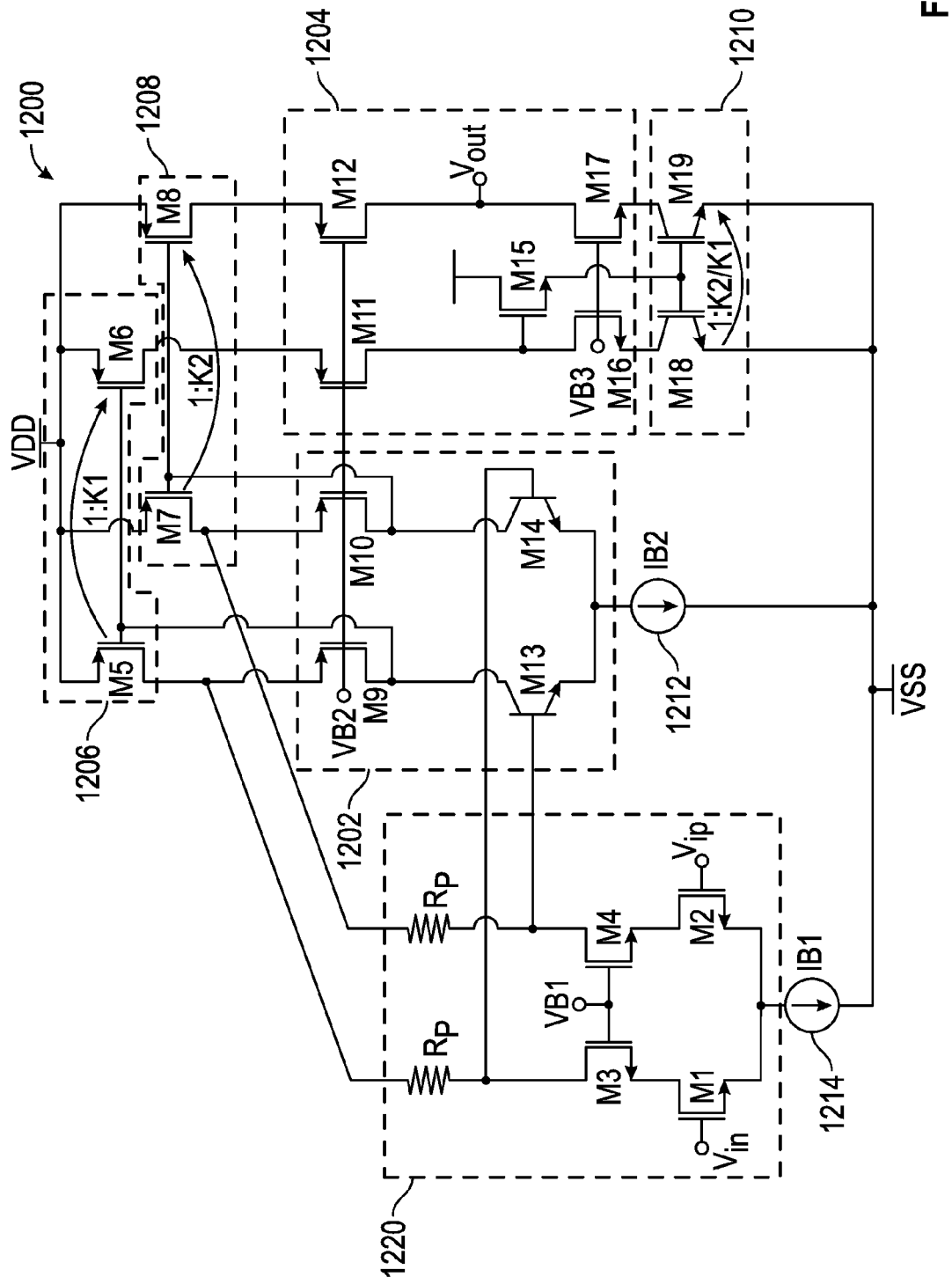
FIG. 12 illustrates another exemplary OTA topology with enhanced slew rate using BiCMOS according to examples of the disclosure.

FIG. 12 illustrates another exemplary OTA topology with enhanced slew rate using BiCMOS according to examples of the disclosure. OTA 1200 can have a cascode differential input pre-amplifier gain stage 1220. The main amplifier can have a cascode differential input stage 1202 and a cascode single-ended output stage 1204. Pre-amplifier gain stage 1220 can have bias current, $I_{B1}$, 1214 and main amplifier can have bias current, $I_{B2}$, 1212 at the input stage 1202. The currents of the main amplifier input stage 1202 can be directed to the main amplifier output stage 1204 through current mirrors 1206 and 1208. Current mirrors 1206 and 1208 can have input-output mirroring factors of K1 and K2, respectively. The currents of the pre-amplifier gain stage 1220 can also be directed to the main amplifier output stage 1204 through current mirrors 1206 and 1208. The currents of the main amplifier output stage 1204 can be combined via current mirror 1210. Current mirror 1210 can have an input output mirroring factor of K2/K1.

Mirroring current from pre-amplifier gain stage 1220 to the main amplifier output stage 1204 can increase the slew rate of OTA 1200. In the OTA topology of FIG. 12, the slew current, $I_{Slew}$ and quiescent current, $I_Q$, can be expressed the same way as in equations 6 and 7 above. Thus, OTA 1200 can also provide the advantage of increasing the slew current of the amplifier without increasing the bias current of main amplifier input stage. OTA 1200 can also increase the ratio of slew current to the quiescent current of the amplifier and thereby improve the power efficiency of the amplifier. Additionally, OTA 1200 can operate at a lower supply voltage than OTA 1000 because the diode connected transistors M5 and M7 in FIG. 10 are avoided. Specifically, the supply voltage can be reduced by one PMOS transistor threshold voltage.

The OTA topology in FIG. 12 can replace some MOS transistors in the OTA with Bipolar Junction Transistors (BJTs). The differential pair (M13 and M14) in main amplifier input stage 1202 can be implemented using BJTs because the base current of these transistors can be more easily tolerated if preceded by pre-amplifier 1204. BJTs can be advantageous because they have improved transconductance and therefore higher gain, over MOS transistors with similar bias current. Additionally, the transistors (M18 and M19) of current mirror 1210 can be implemented using BJTs because they can substantially improve noise performance of the OTA 1200. It should be understood that BJT devices can be used to replace other MOS transistors in the OTA.

Although the examples of OTAs disclosed above have been discussed in the context of a charge amplifier in an integrated touch screen, it should be understood that OTAs with enhanced slew rate can be used in other applications requiring a wide bandwidth and large slew rate for high-frequency switching of voltage levels to drive a medium or high capacitive load without increasing the main amplifier bias current and power consumption.

Therefore, according to the above, some examples of the disclosure are directed to an operational transconductance amplifier with enhanced slew rate. The amplifier can comprise a pre-amplifier circuit and a main amplifier circuit. The pre-amplifier circuit can be electrically coupled to an output stage of the main amplifier circuit to transfer current from the pre-amplifier circuit to the output stage of the main amplifier circuit. Additionally or alternatively to one or more examples disclosed above, at least one of the pre-amplifier circuit and the main amplifier circuit can accept a differential input. Additionally or alternatively to one or more examples disclosed above, the pre-amplifier circuit can be electrically coupled to the output stage of the main amplifier circuit by at least a first and a second pair of transistors. The first and second pairs of transistors can be configurable to operate as a pair of current mirrors. Additionally or alternatively to one or more examples disclosed above, an input stage of the main amplifier circuit can be electrically coupled to the output stage of the main amplifier circuit by at least third and a fourth pair of transistors. The third and fourth pairs can be configurable to operate as a pair of current mirrors. Additionally or alternatively to one or more examples disclosed above, the pre-amplifier circuit and an input stage of the main amplifier circuit can be electrically coupled to the output stage of the main amplifier circuit by the first and second pairs of transistors. Additionally or alternatively to one or more examples disclosed above, the pre-amplifier circuit can comprise a differential common-source amplifier using a resistive load. The pre-amplifier circuit can be electrically coupled to the input stage of the main amplifier circuit via the resistive load. Additionally or alternatively to one or more examples disclosed above, at least one of the pre-amplifier circuit and the main amplifier circuit can be implemented using a cascode structure. Additionally or alternatively to one or more examples disclosed above, the amplifier further can comprise a plurality of transistors. Additionally or alternatively to one or more examples disclosed above, at least one transistor can be a metal oxide semiconductor field effect transistor. Additionally or alternatively to one or more examples disclosed above, at least one transistor can be a bipolar junction transistor.

Other examples of the disclosure are directed to a method for enhancing slew rate of an operational transconductance amplifier. The method can comprise forming a main amplifier circuit; forming a pre-amplifier circuit electrically coupled to the main amplifier circuit; and transferring current from a pre-amplifier circuit to an output stage of a main amplifier circuit. Additionally or alternatively to one or more examples disclosed above, the method can further comprise forming the pre-amplifier circuit and the main amplifier circuit to accept differential inputs. Additionally or alternatively to one or more examples disclosed above, the method can further comprise coupling the pre-amplifier circuit to the main amplifier circuit output stage using current mirrors. Additionally or alternatively to one or more examples disclosed above, the method can further comprise coupling an input stage of the main amplifier circuit to the output stage of the main amplifier circuit using current mirrors. Additionally or alternatively to one or more examples disclosed above, the method can further comprise coupling the pre-amplifier circuit and an input stage of the main amplifier circuit to the output stage of the main amplifier circuit using shared current mirrors. Additionally or alternatively to one or more examples disclosed above, the method can further comprise coupling the pre-amplifier circuit to the input stage of the main amplifier circuit via a resistive load.

Other examples of the disclosure are directed to an operational transconductance amplifier with enhanced slew rate. The amplifier can comprise a pre-amplifier circuit configurable as a differential common-source amplifier and a main amplifier circuit comprising a differential input stage. A differential output voltage of the pre-amplifier circuit can be electrically coupled the differential input stage of the main amplifier circuit and the pre-amplifier circuit can be electrically coupled to an output stage of the main amplifier circuit to transfer current from the pre-amplifier circuit to the output stage of the main amplifier circuit. Additionally or alternatively to one or more examples disclosed above, at least one of the pre-amplifier circuit or the main amplifier circuit can be implemented using a cascode structure. Additionally or alternatively to one or more examples disclosed above, the pre-amplifier circuit can be electrically coupled to the output stage of the main amplifier circuit by at least a first and a second pair of transistors. The first and second pairs of transistors can be configurable to operate as a pair of current mirrors. Additionally or alternatively to one or more examples disclosed above, the differential input stage of the main amplifier circuit can be electrically coupled to the output stage of the main amplifier circuit by at least third and a fourth pair of transistors. The third and fourth pairs can be configurable to operate as a pair of current mirrors. Additionally or alternatively to one or more examples disclosed above, the pre-amplifier circuit and the differential input stage of the main amplifier circuit can be electrically coupled to the output stage of the main amplifier circuit by the first and second pairs of transistors. Additionally or alternatively to one or more examples disclosed above, the differential common-source amplifier of the pre-amplifier circuit can further comprise a resistive load and the pre-amplifier circuit can be electrically coupled to the differential input stage of the main amplifier circuit via the resistive load.

Although examples have been fully described with reference to the accompanying drawings, it is to be noted that various changes and modifications will become apparent to those skilled in the art. Such changes and modifications are to be understood as being included within the scope of the various examples as defined by the appended claims.

What is claimed is:

1. An operational transconductance amplifier with enhanced slew rate, the amplifier comprising:
   a pre-amplifier circuit; and
   a main amplifier circuit, the main amplifier circuit comprising an input stage and an output stage;
   wherein an amplified signal output of the pre-amplifier circuit is coupled to a signal input of the input stage of the main amplifier circuit;
   wherein at least one of the pre-amplifier circuit and the main amplifier circuit is configured to accept a differential input;
   wherein the pre-amplifier circuit is electrically coupled to the output stage of the main amplifier circuit by at least a first pair and a second pair of transistors configured to transfer current from the pre-amplifier circuit to the output stage of the main amplifier circuit; and
   wherein the input stage of the main amplifier circuit is electrically coupled to the output stage of the main amplifier circuit by at least a third pair and a fourth pair of transistors.

2. The amplifier of claim 1, wherein the first and second pairs of transistors are configurable to operate as a pair of current mirrors.

3. The amplifier of claim 1, wherein the third and fourth pairs of transistors are configurable to operate as a pair of current mirrors.

4. An operational transconductance amplifier with enhanced slew rate, the amplifier comprising:
   a pre-amplifier circuit; and
   a main amplifier circuit, the main amplifier circuit comprising an input stage and an output stage;
   wherein an amplified signal output of the pre-amplifier circuit is coupled to a signal input of the input stage of the main amplifier circuit;
   wherein at least one of the pre-amplifier circuit and the main amplifier circuit is configured to accept a differential input;
   wherein the pre-amplifier circuit is electrically coupled to an output stage of the main amplifier circuit by at least a first pair and a second pair of transistors configured to transfer current from the pre-amplifier circuit to the output stage of the main amplifier circuit; and
   wherein the pre-amplifier circuit and the input stage of the main amplifier circuit are electrically coupled to the output stage of the main amplifier circuit by the first and second pairs of transistors.

5. The amplifier of claim 4 wherein the pre-amplifier circuit comprises a differential common-source amplifier using a resistive load and the pre-amplifier circuit is electrically coupled to the input stage of the main amplifier circuit via the resistive load.

6. The amplifier of claim 1, wherein at least one of the pre-amplifier circuit and the main amplifier circuit is implemented using a cascode structure.

7. The amplifier of claim 1, the amplifier further comprising a plurality of transistors, wherein at least one of the plurality of transistors is a metal oxide semiconductor field effect transistor.

8. The amplifier of claim 7, wherein at least one of the plurality of transistors is a bipolar junction transistor.

9. A method for enhancing slew rate of an operational transconductance amplifier, the method comprising:
   forming a main amplifier circuit, the main amplifier circuit comprising an input stage and an output stage;
   forming a pre-amplifier circuit electrically coupled to the main amplifier circuit, wherein an amplified signal output of the pre-amplifier circuit is coupled to a signal input of the input stage of the main amplifier circuit, wherein at least one of the pre-amplifier circuit and the main amplifier circuit is configured to accept a differential input; and
   transferring current from a pre-amplifier circuit to the output stage of a main amplifier circuit by at least a first pair and a second pair of transistors.

10. The method of claim 9, further comprising coupling the pre-amplifier circuit to the main amplifier circuit output stage using current mirrors.

11. The method of claim 10, further comprising coupling the input stage of the main amplifier circuit to the output stage of the main amplifier circuit using current mirrors.

12. The method of claim 11, further comprising coupling the pre-amplifier circuit and the input stage of the main amplifier circuit to the output stage of the main amplifier circuit using shared current mirrors.

13. The method of claim 12, further comprising coupling the pre-amplifier circuit to the input stage of the main amplifier circuit via a resistive load.

14. An operational transconductance amplifier with enhanced slew rate, the amplifier comprising:
   a pre-amplifier circuit configurable as a differential common-source amplifier; and
   a main amplifier circuit comprising a differential input stage and an output stage;
   wherein a differential output voltage of the pre-amplifier circuit is electrically coupled to the differential input stage of the main amplifier circuit and the pre-amplifier circuit is further electrically coupled by at least a first pair and a second pair of transistors to the output stage of the main amplifier circuit, the first pair and the second pair of transistors configured to transfer current from the pre-amplifier circuit to the output stage of the main amplifier circuit.

15. The amplifier of claim 14, wherein at least one of the pre-amplifier circuit or the main amplifier circuit is implemented using a cascode structure.

16. The amplifier of claim 14, wherein the first and second pairs of transistors are configurable to operate as a pair of current mirrors.

17. The amplifier of claim 16, wherein the differential input stage of the main amplifier circuit is electrically coupled to the output stage of the main amplifier circuit by at least third and a fourth pair of transistors, the third and fourth pairs configurable to operate as a pair of current mirrors.

18. The amplifier of claim 16, wherein the pre-amplifier circuit and the differential input stage of the main amplifier circuit are electrically coupled to the output stage of the main amplifier circuit by the first and second pairs of transistors.

19. The amplifier of claim 18 wherein the differential common-source amplifier of the pre-amplifier circuit further comprises a resistive load and the pre-amplifier circuit is electrically coupled to the differential input stage of the main amplifier circuit via the resistive load.

20. The amplifier of claim 4, wherein at least one of the pre-amplifier circuit and the main amplifier circuit is implemented using a cascode structure.

21. The amplifier of claim 4, the amplifier further comprising a plurality of transistors, wherein at least one of the plurality of transistors is a metal oxide semiconductor field effect transistor.

22. The amplifier of claim 21, wherein at least one of the plurality of transistors is a bipolar junction transistor.

* * * * *